United States Patent [19]

Kudoh

[11] Patent Number: 5,159,416
[45] Date of Patent: Oct. 27, 1992

[54] THIN-FILM-TRANSISTOR HAVING SCHOTTKY BARRIER

[75] Inventor: Osamu Kudoh, Tokyo, Japan

[73] Assignee: NEC Corporation, Tokyo, Japan

[21] Appl. No.: 691,802

[22] Filed: Apr. 26, 1991

[30] Foreign Application Priority Data

Apr. 27, 1990 [JP] Japan ................. 2-112395
Sep. 27, 1990 [JP] Japan ................. 2-257745

[51] Int. Cl.$^5$ ............... H01L 27/01; H01L 27/02; H01L 29/48
[52] U.S. Cl. .................. 357/23.7; 357/42; 357/15
[58] Field of Search ............. 357/23.7, 42, 15

[56] References Cited

U.S. PATENT DOCUMENTS

| 4,754,314 | 6/1988 | Scott et al. ............. | 357/23.7 |
| 4,814,854 | 3/1989 | Tigelaar et al. .......... | 357/42 |
| 4,942,441 | 7/1990 | Konishi et al. ........... | 357/4 |

FOREIGN PATENT DOCUMENTS

| 73487 | 3/1983 | European Pat. Off. . |
| 334052 | 9/1989 | European Pat. Off. . |
| 58-114453 | 7/1983 | Japan . |

OTHER PUBLICATIONS

Patent Abstracts of Japan, vol. 13, No. 136 (E-737), 05 Apr. 1989 & JP-A-63 300566 (Sharp Corp.) 07 Dec. 1988.
Patent Abstracts of Japan, vol. 12, No. 293 (E-645), 10 Aug. 1988 & JP-A-63 070576 (Kamatsu Ltd.), 30 Mar. 1988.
Patent Abstracts of Japan, vol. 013, No. 507 (E-845), 14 Nov. 1989 & JP-A-01 202870 (NEC Corp.), 15 Aug. 1989.
Patent Abstracts of Japan, vol. 10, No. 236 (E-428), 15 Aug. 1986 & JP-A-61 69164 (NEC Corp.), 09 Apr. 1986.
Patent Abstracts of Japan, vol. 7, No. 58 (E-163)(1203), 10 Mar. 1983 & JP-A-57 204171 (Mitsubishi Denki K.K.), 14 Dec. 1982.
Journal of the Electrochemical Society, vol. 136, No. 5, May 1989, Manchester, New Hamp., pp. 1456-1459; Bing-Yue Tsui et al.: "A Novel Process for High-Performance Schottky Barrier PMOS".

Primary Examiner—Rolf Hille
Assistant Examiner—Robert Limanek
Attorney, Agent, or Firm—Burns, Doane, Swecker & Mathis

[57] ABSTRACT

Disclosed herein is a semiconductor device including a thin-film-transistor which comprises a silicon film formed on an insulating layer and including a substrate area, a gate provided to form a channel in the substrate area, a source consisting of a first metal silicide film forming a Schottky barrier with the substrate area, and a drain including a second metal silicide film. The second metal silicide film forms a Schottky barrier with the substrate area or is in ohmic contact with an impurity region selectively formed in the silicon film with a PN junction with the substrate area.

6 Claims, 6 Drawing Sheets

THIN-FILM-TRANSISTOR HAVING SCHOTTKY BARRIER

BACKGROUND OF THE INVENTION

The present invention relates to a semiconductor device and, more particularly, to a semiconductor integrated circuit device provided with a thin-film-transistor (called hereinafter a "TFT") forming on an insulating layer covering a silicon substrate.

TFT employs, as a substrate area in which a channel is to be formed, a silicon thin film formed on an insulating layer and includes source and drain regions and a gate electrode. The source and drain regions are selectively formed in the substrate area with an conductivity type opposite to that of the substrata area. The gate electrode is formed on a gate insulating film covering the substrate area between the source and drain regions.

Recently, as it has been proposed to employ TFT as load elements of a static random access memory (SRAM) cell, research and development have been being carried forward on an integrated circuit device including TFTs together with metal-insulator-semiconductor (MIS) transistors using a part of a silicon substrate as a substrate area. In order that such a device displays desirable performance, an improvement in TFT electrical characteristics is required. A large leakage current is one of the inferior characteristics of TFT to the MIS transistor. For reducing a leakage current, it is known in the art to form the substrate area very thin, less than 500 Å, for example.

However, forming the substrate area thin causes an increase in series resistance of the source and drain regions. Additional low resistivity conductive layers such as a metal are, therefore required to connect the source and drain regions to a signal source or a power supply source, resulting in increase in manufacturing steps. Moreover, such additional conductive layers restrict an increase in memory capacity of SRAM employing TFTs.

SUMMARY OF THE INVENTION

Therefore, it is an object of the present invention to provide a semiconductor device including an improved TFT.

It is another object of the present invention to provide a semiconductor device provided with TFT having a small leakage current characteristic without increasing the series resistance of the source and drain.

It is still another object of the present invention to provide a semiconductor integrated circuit device including TFT suitable for serving as a load element of a MIS transistor.

A semiconductor device according to the present invention includes a thin-film-transistor which comprises a silicon thin film formed on an insulating layer and including a substrate area, a gate provided to form a channel in the substrate area, at least one metal silicide film provided on the silicon thin film to form a Schottky barrier therebetween, a source, and a drain, the metal silicide film constituting at least one of the source and drain such that the Schottky barrier provides a junction between the one of the source and drain and the substrate area.

Thus, TFT according to the present invention has at least one of the source and drain composed of the silicide film and defined by the Schottky barrier. The Schottky barrier formed by the silicide film has a satisfactory diode characteristic to the substrate area. Moreover, the silicide film has sufficiently small resistivity and thus operates as an interconnection or wiring layer. Accordingly, even when the silicon thin film is formed thin for the purpose of reducing a leakage current, any additional conductive layer is not required.

According to one preferred embodiment of the present invention, both of the source and drain are formed of silicide film and thus defined by Schottky barrier.

According to another embodiment of the present invention, only one of the source and drain, preferably the source, is made of the silicide film to be defined by the Schottky barrier, and the other of them, i.e. drain, is made of an impurity region formed in the silicon film with a conductivity type opposite to that of the silicon film to be defined by a PN junction. Moreover, a silicide film is formed on the impurity region with an ohmic contact. The leakage current is thereby further reduced.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE EMBODIMENTS

Figure 1:
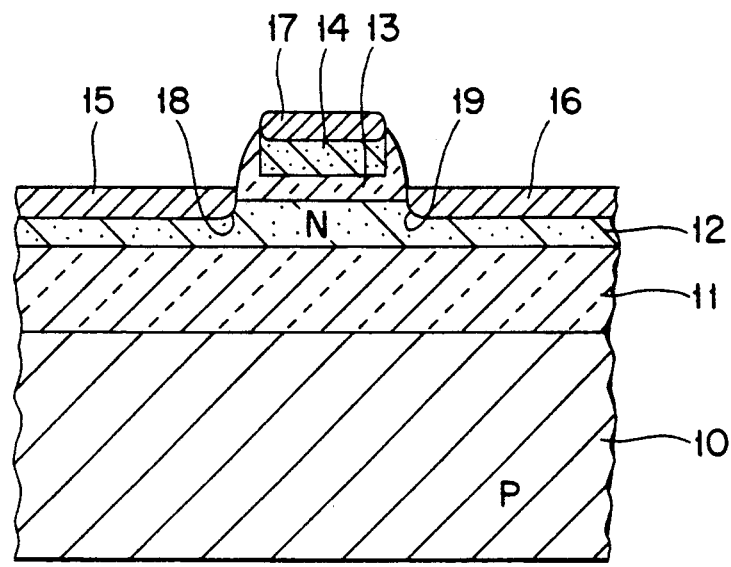
FIG. 1 is a cross sectional view representative of a first embodiment of the present invention.

Next, a detailed description of the embodiments according to the present invention will be given below with reference to drawings, wherein the same constituents are denoted by the same reference numerals throughout the embodiments. Further, it is apparent that impurity conductivity types and materials indicated in the following description can be changed and modified.

Referring now to FIG. 1, a semiconductor device according to a first embodiment of the present invention includes a P-type silicon substrate 10 covered with a field silicon dioxide layer 11 of about 0.5 μm thick. Formed on the field oxides layer 11 is a polycrystalline silicon film 12 400 Å thick and an impurity concentration of about $1 \times 10^{15} cm^{-3}$. The silicon film 12 serves as a substrate area of TFT. The polycrystalline silicon film 12 is formed by polycrystallizing an amorphous silicon layer deposited on the field layer 11. In accordance with the present invention, titanium silicide films 15 and 16 are selectively formed on the silicon film 12 to form Schottky barriers 18 and 19 therebetween, respectively. The silicide films 15 and 16 serve as source and drain regions, respectively. These films 15 and 16 are formed by carrying out a heat treatment on titanium films selectively deposited on the silicon film 12. Thus, the source 15 and drain 16 are defined by the Schottky barriers 18 and 19, respectively. A gate silicon dioxide film 13 covers the portion of the silicon film 12 between the source 15 and drain 16, and an N-type polycrystalline silicon gate electrode 14 having impurity concentration of about $1 \times 10^{20}$ cm$^{-3}$ is formed on the gate oxide film 13. A titanium silicide film 17 is formed on the gate electrode 14 having an ohmic contact therewith.

The TFT is provided with the silicide films 15 and 16 operating as the source and drain, respectively. Since the Schottky barriers 18 and 19 of the source 15 and drain 16 show a satisfactory diode characteristic and since the silicon film 12 is formed thin as the substrate area of TFT, a sufficiently small leakage current characteristic is obtained. Moreover, the sheet resistance of the silicide films 15 and 16 is about 5 $\Omega/\square$ and thus considerably small, and hence the films 15 and 16 are employed as wiring layers for a power supply and/or a signal transmission.

Metals such as platinum, tungsten and molybdenum can be used for forming the silicide films 15, 16 and, 17.

Figure 2:
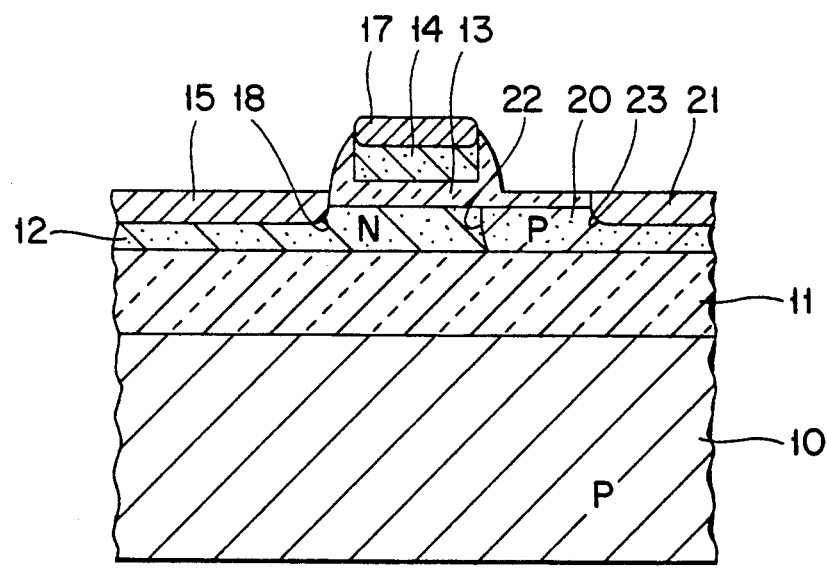
FIG. 2 is a cross sectional view representative of a second embodiment of the present invention.

The leakage current of TFT becomes further smaller by use of a PN junction. More specifically, as shown in FIG. 2 as a second embodiment of the present invention, a P-type region 20 is provided on the side of drain to form a PN junction 22 to the substrate area 12. The region 20 thus serves as a drain. The drain region 20 is formed by ion-implantation with the dose amount of being about $1 \times 10^{13}$ cm$^2$. Therefore, the ion-implantation step is not complicated. A titanum silicide film 21 is formed on the drain region 20. Since the region 20 is of a P-type, the silicide film 21 forms an ohmic contact with the region 20 irrespective of the low impurity concentration thereof.

Figure 3:
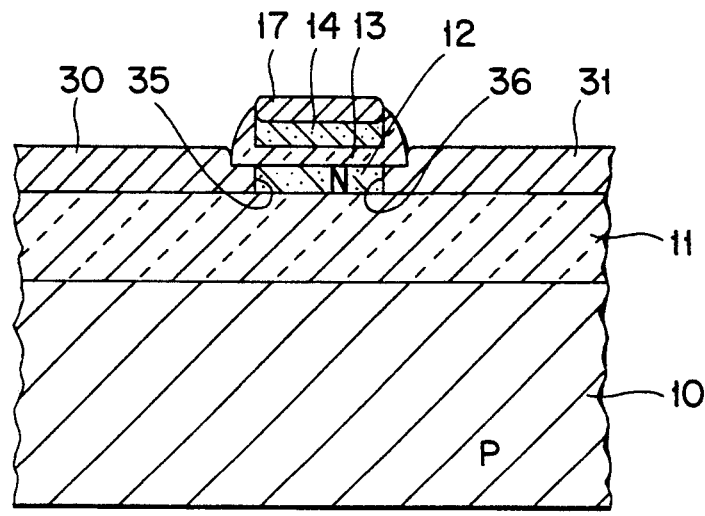
FIG. 3 is a cross sectional view representative of a third embodiment of the present invention.

The reduction in leakage current is also achieved by decreasing the Schottky barrier area. More specifically, as shown in FIG. 3 as a third embodiment of the present invention, source and drain silicide films 30 and 31 are formed to reach the field oxide layer 11. Therefore, the substrate area 12 is formed only beneath the gate electrode 14 to decrease the areas of Schottky barriers 35 and 36. The leakage current is thus further reduced.

Figure 7:
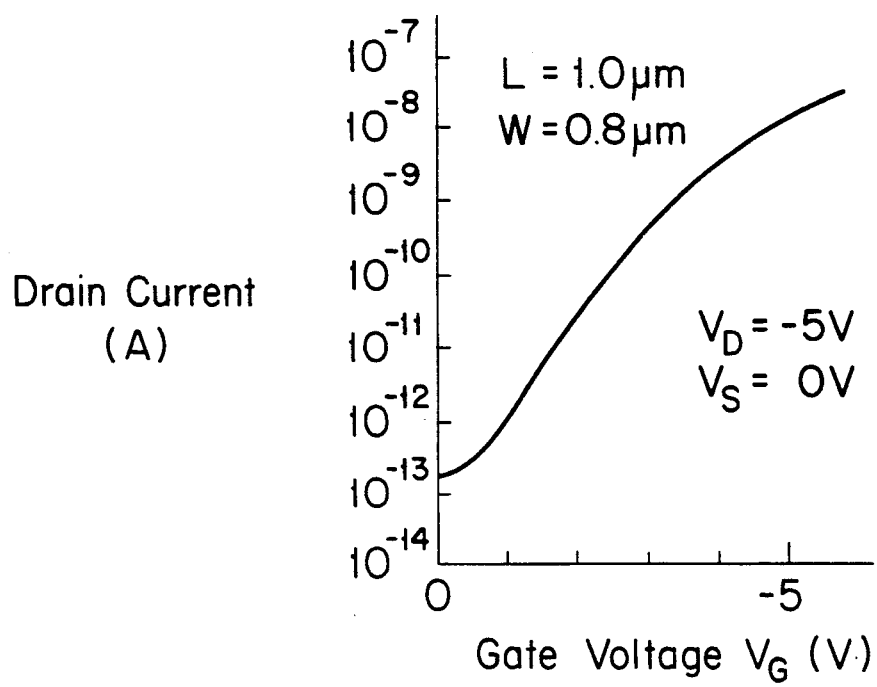
FIG. 7 is a graph representative of a drain current characteristic of TFTs shown in FIGS. 3 and 5.
Figure 8:
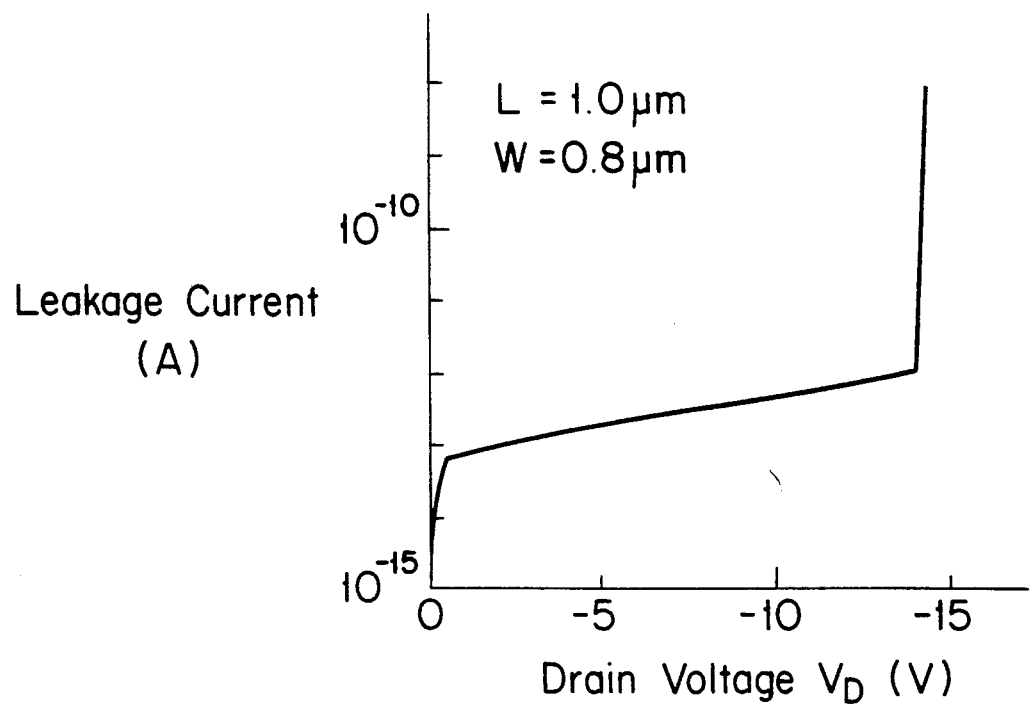
FIG. 8 is a graph representative of a leakage current characteristic of TFTs shown in FIGS. 3 and 5.

FIGS. 7 and 8 show the drain current characteristic and the leakage current characteristic of the TFT according to the third embodiment. The length and width of this TFT gate are 1.0 $\mu$m and 0.8 $\mu$m, respectively. The ratio of a turn-on drain current to a cut-off drain current shows five figures and the leakage current is about $10^{-13}$ [A].

Figure 4:
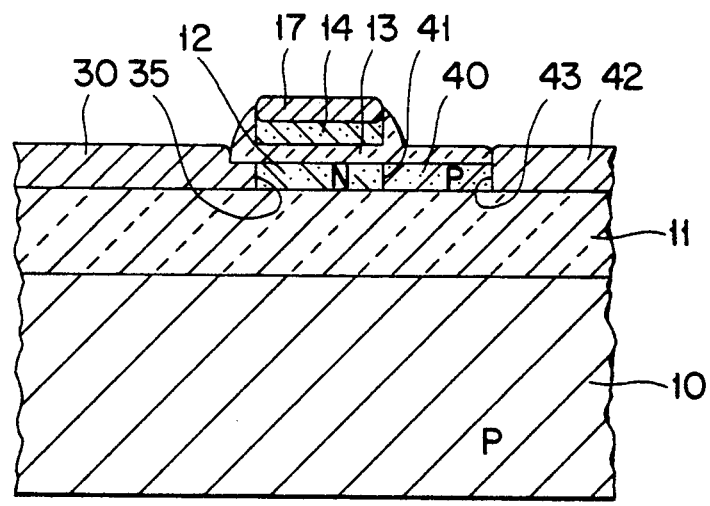
FIG. 4 is a cross sectional view representative of a fourth embodiment of the present invention.

Turning to FIG. 4, the TFT shown therein as a fourth embodiment includes both features of the second and third embodiments shown respectively in FIGS. 2 and 3 in order to further reduce a leakage current. More specifically, a P-type region 40 is employed in place of the drain silicide film 31 shown in FIG. 3 and forms a PN junction 41 with the substrate area 12. Moreover, a titanium silicide film 42 is formed on the region 40 having an ohmic contact therewith. As a result, the leakage current of this TFT has reduced to $5 \times 10^{-14}$ [A].

Figure 5:
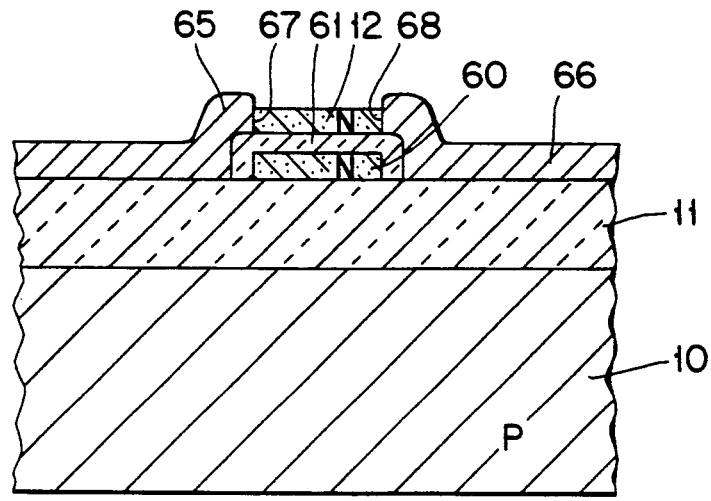
FIG. 5 is a cross sectional view representative of a fifth embodiment of the present invention.

In the above embodiments, the gate electrode 14 is formed above the substrate area 12 as a so-called top gate structure. The present invention is also applicable to a so-called bottom gate structure. That is, as shown in FIG. 5 as a fifth embodiment, an N-type polycrystalline silicon gate electrode 60 is selectively formed on the field oxide layer 11 and then covered with a gate oxide film 61. The substrate area 12 made of N-type polycrystalline silicon is formed on the gate oxide film 61. A titanium silicide film 65 as a source and a titanium silicide film as a drain 66 are formed in contact with the substrate area 12 with Schottky barriers 67 and 68. The TFT according to this embodiment has showed similar characteristics to those shown in FIGS. 7 and 8.

Figure 6:
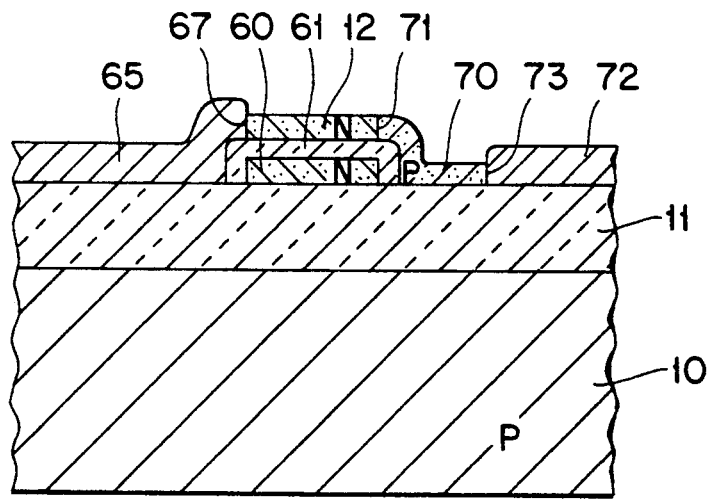
FIG. 6 is a cross sectional view representative of a sixth embodiment of the present invention.

Turning to FIG. 6, there is shown a TFT according to a sixth embodiment in which the technical concept shown in FIG. 4 is applied to the bottom gate structure. More specifically,, a P-type region 70 is formed with a PN junction 71 with the substrate area 12. A titanium silicide area 72 is formed in contact with the region 70 with an ohmic contact.

Figure 9:
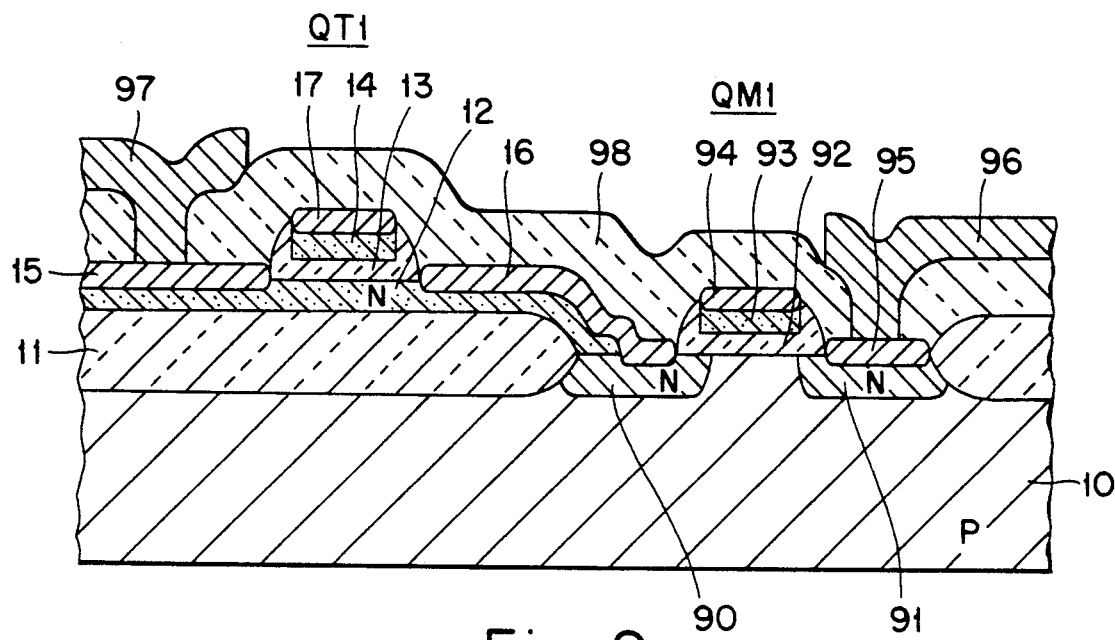
FIG. 9 is a cross sectional view representative of a seventh embodiment of the present invention.

Referring to FIG. 9, an inverter consisting of N-channel type MIS transistor QM1 and a P-channel type TFT QT1 is shown as a seventh embodiment. Since TFT QT1 shown in this embodiment is the same as that shown in FIG. 1, the further description thereof will be omitted. However, the silicon film 12 is elongated over the field oxide layer 11 and then is in contact with an N-type drain region 90 of the transistor QM1. Moreover, the drain silicide film 16 is elongated while forming a Schottky barrier with the silicon film 12 and then also being in contact with the drain region 90. Since this region 90 has high impurity concentration, the silicide film 16 forms an ohmic contact with the region 90. The silicide film 16 is further elongated to be connected to another logic gate (not shown) as an output wiring layer of the inverter. Although the source silicide film 15 of TFT QT1 is applied with an operating voltage through an aluminum wiring layer 97, it may be elongated to receive the operating voltage.

The transistor QM1 includes drain and source regions 90 and 91 selectively formed in the substrate 10 and an N-type polycrystalline silicon gate electrode 93 formed on a gate oxide film 92 covering the portion of the substrate 10 between, the drain and source regions 90 and 91. Titanium silicide films 94 and 95 are respectively formed on the gate electrode 93 and the source region 91 with an ohmic contact. An aluminum wiring layer 96 applies a ground potential to the source region 91. The reference numeral 98 denotes a borophosphosilicate glass layer.

The gate electrode 14 of TFT QT1 and the gate electrode 93 of MIS transistor QM1 are connected in common to receive an input signal to be inverted. Thus, the present inverter operates in the same manner as an ordinal CMOS inverter consisting of P-channel and N-channel MIS transistors.

Figure 10:
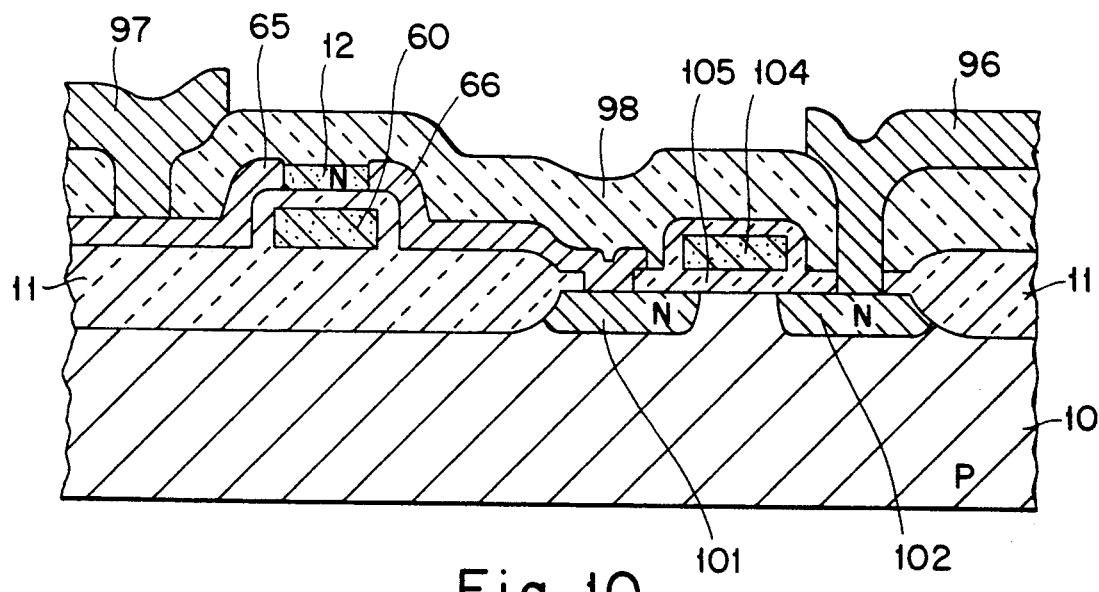
FIG. 10 is a cross sectional view representative of an eighth embodiment of the present invention.

Any inverters shown in FIGS. 2 to 6 can be employed as TFT. An inverter employing the TFT of FIG. 5 is shown in FIG. 10 as an eighth embodiment. More specifically, the drain silicide film 66 of TFT Q2 is elongated over the field oxide layer 11 and then connected to a drain region 101 of MIS transistor QM2 with an ohmic contact. The silicide film 66 is further lead out as an output wiring layer of this inverter. The transistor QM2 includes an N-type polycrystalline silicon gate electrode 104 formed on a gate oxide film 105 and connected in common to the gate electrode 60 of TFT Q2 to receive an input signal. Although the ground wiring layer 96 is connected directly to source region 102, a silicide layer may be intervened therebetween.

Thus, a complementary inverter is provide with a low leakage current characteristic as well as a small occupied area.

Figure 11A:
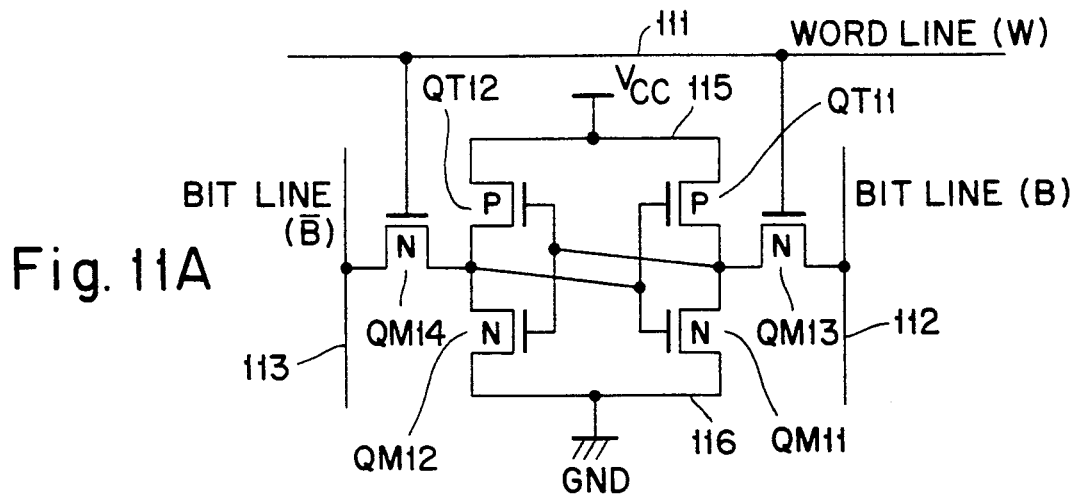
FIGS. 11A, 11B and 11C are an equivalent circuit diagram, a plan view and a cross sectional view along a line I—I' shown in FIG. 11B, respectively, representative of an SRAM cell according to a ninth embodiment of the present invention.

As shown in FIG. 11A, a SRAM cell is constituted of two inverters consisting respectively of P-channel and N-channel transistors (QT11, QM11) and (QT12, QM12) and two transfer gate transistors QM13 and QM14. Therefore, the cell can be constructed by the inverter shown in FIG. 9 or FIG. 10. However, the TFT is formed at a distance from the MIS transistor in those inverters, and hence there is room for improvement in miniaturization of a cell area.

Figure 11B:
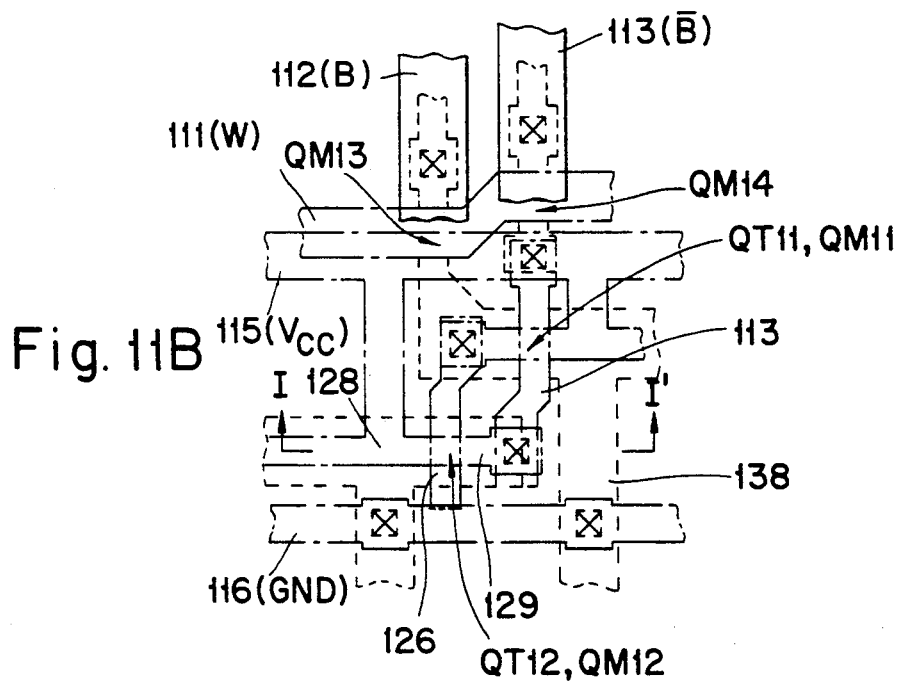
Figure 11C:
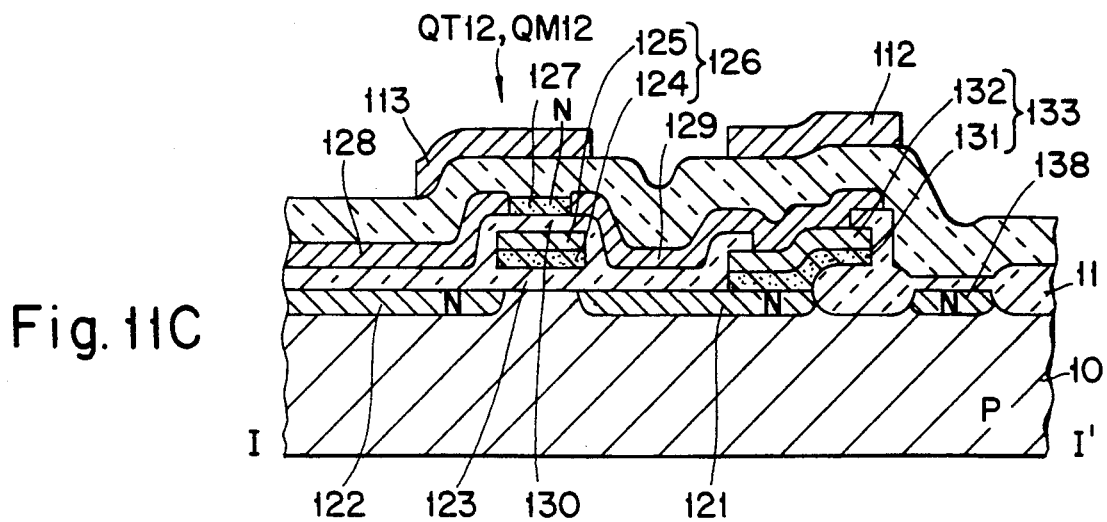

Therefore, an a SRAM cell having a miniaturized area is shown in FIGS. 11B and 11C as a ninth embodiment. In this cell, P-channel transistors QT11 and QT12 are made of TFT and N-channel transistors QM11 to QM14 are made of MIS transistor. Further, the bottom gate type TFT shown in FIG. 5 is employed so that the gates of TFTs QT11 and QT12 are used in common as those of MIS transistors QM11 and QM12, respectively.

More specifically, as shown in FIG. 11C, the transistor QM12 includes a gate electrode 126 formed on a gate oxide film 123 covering a portion of the substrate 10 between source and drain regions 122 and 121. The gate electrode 126 consists of an N-type polycrystalline silicon layer 124 and a tungsten silicide layer 125 formed thereon. A substrate area 127 of TFT QT2 is formed on a silicon dioxide film 130 as a gate insulating film provided on the gate electrode 126. Titanium silicide films 128 and 129 for source and drain are formed with Schottky barriers with the substrate area 127. The silicide film 128 is elongated to serve as a power wiring layer to receive a power voltage Vcc and as a source of TFT QT11. The drain silicide film 129 is connected to a gate electrode 133 of the transistor QM11. The gate electrode 133 consists of a polycrystalline silicon layer 131 and a tungsten silicide layer 132 similarly to the gate electrode 126 and is connected to the drain region 121 of the transistor QM12. The gate electrode 133 is further connected to the transfer gate transistor QM14 (see FIG. 11B). The source regions 122 and 138 of the transistors QM12 and QM11 are connected to a titanium silicide layer 116 for a ground potential wiring layer. Since the structures of TFT QT11 and MIS transistor QM11 are the same as those shown in FIG. 11C, the description thereof will be omitted.

Thus, the above SRAM cell shows a desired data holding characteristic due to a small leakage current and occupies a substantially small area. Accordingly, a SRAM having large memory capacity is provided.

It is apparent that the present invention is not limited to the above embodiments but may be modified and changed without departing from the scope and spirit of the invention.

What is claimed is:

1. A semiconductor device having a thin-film-transistor and an insulated gate transistor on a single semiconductor substrate, said thin-film-transistor comprising a silicon film formed on an insulating layer covering said semiconductor substrate, at least one portion of said silicon film serving as a body area, a gate provided to form a channel in said body area, a source consisting of a first silicide film forming a Schottky barrier with said body area, and a drain including a second silicide film, and said insulated gate transistor comprising impurity regions serving as source and drain and selectively formed in said semiconductor substrate and a gate formed on a gate insulating film covering a part of said semiconductor substrate between said impurity regions, said second silicide film being elongated to connected to one of said impurity regions with an ohmic contact.

2. The semiconductor device as claimed in claim 1, wherein said second silicide film forms a Schottky barrier with said body area so that said drain of said thin-film-transistor is defined by said Schottky barrier.

3. The semiconductor device as claimed in claim 1, wherein said drain of said thin-film-transistor further includes a semiconductor region forming a PN junction with said body area, said second silicide film being in ohmic contact with said semiconductor region.

4. A semiconductor device including an insulated gate transistor and a thin-film-transistor on a semiconductor substrate, said insulated gate transistor comprising source and drain regions selectively formed in said semiconductor substrate and a gate electrode formed on a first gate insulating film covering a portion of said semiconductor substrate between said source and drain regions, said thin-film-transistor comprising a silicon film formed on a second gate insulating film covering said gate electrode, said silicon film forming a channel therein under control of said gate electrode, a source consisting of a first silicide film forming a Schottky barrier with said silicon film, and a drain including a second silicide film, said second silicide film being elongated to be in ohmic contact with said drain region of said insulated gate transistor.

5. The semiconductor device as claimed in claim 4, wherein said second silicide film forms a Schottky barrier with said silicon film so that said drain is defined by said Schottky barrier.

6. The semiconductor device as claimed in claim 4, wherein said drain of said thin-film-transistor further includes an impurity region forming a PN junction with said silicon film, said second silicide film being in ohmic contact with said impurity region.

* * * * *